United States Patent
Semeria et al.

(10) Patent No.: US 6,724,017 B2
(45) Date of Patent: Apr. 20, 2004

(54) METHOD FOR AUTOMATIC ORGANIZATION OF MICROSTRUCTURES OR NANOSTRUCTURES AND RELATED DEVICE OBTAINED

(75) Inventors: Marie-Noëlle Semeria, St. Nizier du Moucherotte (FR); Pierre Mur, Crolles (FR); Franck Fournel, Moirans (FR); Hubert Moriceau, Saint-Egreve (FR); Hubert Eymery, Sassenage (FR); Noël Magnea, Moirans (FR); Thierry Baron, Fontaine (FR); François Martin, Grenoble (FR)

(73) Assignees: Commissariat a l'Energie Atomique, Paris (FR); Centre National de la Recherche Scientific, Paris (FR)

(*) Notice: Subject to any disclaimer, the term of this patent is extended or adjusted under 35 U.S.C. 154(b) by 0 days.

(21) Appl. No.: 10/381,212
(22) PCT Filed: Oct. 5, 2001
(86) PCT No.: PCT/FR01/03073
§ 371 (c)(1), (2), (4) Date: Mar. 28, 2003
(87) PCT Pub. No.: WO02/29131
PCT Pub. Date: Apr. 11, 2002

(65) Prior Publication Data
US 2003/0186512 A1 Oct. 2, 2003

(30) Foreign Application Priority Data
Oct. 6, 2000 (FR) .............................. 00 12797

(51) Int. Cl.⁷ ............................................ H01L 31/109
(52) U.S. Cl. .................... 257/183; 257/190; 257/18; 438/478; 438/758
(58) Field of Search ............................... 257/183, 190, 257/12, 14, 15, 18; 438/478, 758

(56) References Cited

U.S. PATENT DOCUMENTS 6,261,928 B1 * 7/2001 Bruel .......................... 438/459
6,583,436 B2 * 6/2003 Petroff et al. ................. 257/18
6,657,232 B2 * 12/2003 Morkoc ....................... 257/76

FOREIGN PATENT DOCUMENTS

EP 0 598 361 5/1994
FR 2 766 620 1/1999

OTHER PUBLICATIONS

Y. Enomoto, Thin Solid Films, vol. 369, No. 1–2, pp. 21–24, XP–004200316, "Dynamics of Surface Phase Seperation on Patterned Substrates by Molecular Beam Epitaxy", Jul. 2000.
K. Häusler, et al., Solid State Electronics, vol. 40, Nos. 1–8, pp. 803–806, XP–004017899, "Ordering of Nanoscale InP Islands on Strain–Modulated InGaP Buffer Layers", 1996.
I. Mukhametzhanov, et al., Applied Physics Letters, vol. 73, No. 13, pp. 1841–1843, XP–000784174, "Independent Manipulation of Density and Size of Stress–Driven Self–Assembled Quantum Dots", Sep. 28, 1998.

* cited by examiner

Primary Examiner—Sara Crane
(74) Attorney, Agent, or Firm—Oblon, Spivak, McClelland, Maier & Neustadt, P.C.

(57) ABSTRACT

The invention relates to a device comprising microstructures or nanostructures on a support, characterized in that the support comprises:
a) a substrate (1) comprising at least one part composed of a crystalline material, this part having a surface (2) with a stress field or a topology associated with a stress field, the stress field being associated with dislocations,
b) an intermediate layer (3) bonded to the surface (2), and having a thickness and/or composition and/or a surface state enabling transmission of said stress field through this layer as far as its free face that supports microstructures or nanostructures (4).

26 Claims, 2 Drawing Sheets

METHOD FOR AUTOMATIC ORGANIZATION OF MICROSTRUCTURES OR NANOSTRUCTURES AND RELATED DEVICE OBTAINED

TECHNICAL FIELD

The invention relates to an auto-organisation process for microstructures or nanostructures in a two-dimensional or three-dimensional lattice. It also relates to a device with auto-organised microstructures or nanostructures.

These microstructures or nanostructures are designed for making electronic, optical, opto-electronic or magnetic devices, and particularly Coulomb blocking devices using quantum dots.

STATE OF PRIOR ART

It is known that a microstructure or nanostructure arrangement on a surface can be determined using conventional photolithoetching methods. For example, a continuous layer of material chosen as a constituent of microstructures or nanostructures can be deposited on a surface. This may be a layer of silicon deposited by LPCVD. This layer is covered by a photosensitive film. After this film has been exposed, the geometries are recorded and are then transferred to the subjacent material. The state of the art is thus capable of defining nanostructures of the order of 20 nm. This is too large for target applications of the invention.

New methods, called "nano-printing", are capable of defining nanometric structures, for example by deformation of a polymer with a mould. In this case also, the order of magnitude of structures thus defined is not easily less than 20 nm.

Techniques for material auto-organisation are also known by which nanostructures can be grown; growth on the edge of the steps of a vicinal surface, auto-organisation by dislocation lattices obtained during growth of metals, auto-organisation by dislocations during growth of different semi-conducting layers. Auto-organisation is also possible by stacking nanostructures or by growing nanostructures on stressed surfaces with a variation in their topology due to relaxation of the internal stress. Impurities on the epitaxy surface can also be used. None of these techniques appears to make auto-organisation of nanostructures of nanometric size feasible with a good size uniformity.

It is also known that a crystalline nanostructure organisation can be obtained from a crystalline substrate on the surface of which a stress field was generated. Nanostructures can be obtained by selective treatment of the substrate and in this case the material forming the nanostructures is the same as for the substrate. They may also be obtained by epitaxial growth and in this case the crystalline substrate and the crystalline nanostructures are composed of materials that are different because they have different cell parameters.

Document FR-A-2 766 620 discloses a process for making microstructures or nanostructures on a support. The process comprises a step in which two wafers of crystalline material are brought into contact such that the crystalline lattices present on the faces of the wafers put into contact are offset by an angle enabling the formation of a lattice of crystalline defects within a crystalline zone close to the interface of the two wafers. A subsequent step to thin one of the two wafers reveals the microstructure or nanostructure on a support composed of the other wafer. The unthinned wafer may be an SOI substrate, for which the silicon surface film is brought into contact with the thinned wafer.

There are several problems inherent to these known processes.

A first problem is due to the fact that the nanostructures are in direct contact with the support substrate, even if the space between the nanostructures may be of different nature, and particularly different electrical nature, after appropriate treatment such as heat treatment. However, it may be useful to avoid current leaks between nanostructures and the support substrate. This type of leak makes the system unusable for controlling the transport of an electron from one nanostructure to another.

A second problem is the result of the fact that processes according to prior art require the generation of a stress field in the substrate, which limits the choice of the material from which the nanostructures are made. Cell parameters of the substrate and nanostructures must be compatible with the formation of nanostructures when the second material is deposited on the substrate. It is impossible to deposit nanostructures of the same nature as the substrate. For example, it would be very interesting to make silicon nanostructures on silicon substrates, since silicon is well known and is widely used in the microelectronics field.

A third problem relates to optimisation of nanostructure devices.

SUMMARY OF THE INVENTION

The invention proposes a solution to the problems described above. It relates to an auto-organisation process for microstructures or nanostructures in a two-dimensional or three-dimensional lattice, on an intermediate layer with a nature that may advantageously be different from the nature of the substrate. This intermediate layer is chosen so as to not hinder the organisation of nanostructures on the substrate. This arrangement is correlated to a stress field created on the surface of the substrate and transmitted through the intermediate layer as far as its surface. This arrangement of microstructures or nanostructures on the surface of the intermediate layer may in turn be used to organise one or several subsequent depositions of microstructures or nanostructures.

The invention is a means of independently choosing the substrate and the material from which nanostructures are composed.

The substrate is crystalline, single-material or composite. The intermediate layer may be crystalline or amorphous.

The nanostructures obtained according to the invention are in the form of a lattice of volumes with dimensions typically varying from one to several nanometers. These nanostructures may be made of a conducting, semiconducting or dielectric material with a crystalline or amorphous structure. For example, IV—IV compounds including Si, Ge, C, II–VI compounds, III–V compounds, $Al_2O_3$, $SiO_2$ and $Si_3N_4$, magnetic materials including Co, Ni, CoNi and semi-metallic materials such as Bi and NiMnSb may be used.

The invention enables the economical deposition of auto-organised nanostructures since the deposition is made in a single step over the entire surface. The dimensions of nanostructures vary from 1 nm to a few tens of nm.

The intermediate layer in the invention prevents any contamination of nanostructures by the substrate. Its function is firstly to facilitate putting nanostructures into order on the substrate and secondly to isolate nanostructures from the substrate.

Therefore, the purpose of the invention is a process for making microstructures or nanostructures on a support comprising the following steps:

a) supply of a substrate comprising at least one part composed of a crystalline material, this part having a surface with a stress field or a topology associated with the stress field, the stress field being associated with dislocations, the surface being adapted to the formation of a layer of material called the intermediate layer, b) formation of the intermediate layer starting from said surface, the thickness and/or composition and/or a surface state of the intermediate layer being chosen such that the stress field can be transmitted through this layer as far as its free face that is suitable for the formation of microstructures or nanostructures, the substrate and the intermediate layer forming said support, c) auto-organised deposition of microstructures and nanostructures on the free face of the intermediate layer.

Step a) may include bringing two wafers of crystalline material into contact such that the crystalline lattices formed on the faces of the wafers brought into contact are offset by an angle enabling the formation of a network of crystalline defects within a crystalline zone close to the interface of the two wafers, one of the wafers then being thinned to reveal said surface with a stress field or topology associated with a stress field.

Step a) may also include a surface treatment to adapt said surface to the formation of an intermediate layer.

The intermediate layer may be a layer deposited on said surface using a PVD and/or a CVD technique. It may also be obtained by a preliminary deposition of a material on said surface, this preliminary deposition being followed by a treatment to obtain the composition chosen for the intermediate layer. It may also be obtained by a treatment transforming a layer of the substrate subjacent to said surface into the composition chosen for the intermediate layer. It may also be obtained by making a layer of the substrate subjacent to said surface react with a material deposited on said surface to obtain said chosen composition.

The intermediate layer may be composed of a stack of sub-layers. According to a first variant, the sub-layers are composed of the same material but have different roughnesses. According to a second variant, the sub-layers are composed of different materials, for example $SiO_2$ and $Si_3N_4$. According to yet another variant, the stack of sub-layers includes sub-layers with stress values with opposed signs. This can give an amplification effect in sub-layers making up the intermediate layer.

The intermediate layer may be formed to have a stress state encouraging the auto-organised deposition of microstructures or nanostructures. To achieve this, it may be formed so that the coefficients of thermal expansion of the intermediate layer and the substrate are different so that the intermediate layer has said stress state. It may also be formed by varying its growth parameters so as to have said stress state. It may also be formed so that its cell parameter is different from the cell parameter of the substrate so that the intermediate layer has said stress state.

The auto-organised deposition of microstructures or nanostructures may be done using a technique chosen from among PVD deposition, CVD deposition, LPCVD deposition, liquid epitaxy, dipping, gaseous epitaxy and plasma deposition.

The auto-organised deposition step may comprise superposition of depositions, a first deposition being made on a free face of the intermediate layer and at least one second deposition being done afterwards to obtain a three-dimensional organisation of the microstructures or nanostructures.

The free face of the intermediate layer may be treated to form a relief on it such that the microstructures or nanostructures are deposited according to a three-dimensional organisation. This relief may be a saw tooth profile.

Another purpose of the invention is a device composed of microstructures or nanostructures on a support, characterised in that this support comprises:

a substrate comprising at least one part made of a crystalline material, this part having a surface with a stress field or a topology associated with a stress field, the stress field being associated with dislocations, an intermediate layer bonded to said surface and having a thickness and/or composition and/or a surface state enabling transmission of said stress field through this layer as far as its free face that supports the microstructures or nanostructures.

The substrate may be composed of a wafer of crystalline material bonding to a thin film of crystalline material at the contact faces, the crystalline lattices presented by the faces in contact being offset by an angle enabling the formation of a lattice of crystalline defects within a crystalline zone close to the interface between the wafer and the thin film.

The intermediate layer may be composed of a stack of sub-layers. It may be a layer with a stress state encouraging auto-organised deposition of microstructures or nanostructures. For example, the coefficients of thermal expansion of the intermediate layer and the substrate may be different so that the intermediate layer has said stress state.

The microstructures or nanostructures may be arranged in superposed layers, thus forming a three-dimensional organisation.

The intermediate layer may have a free face with relief such that the microstructures or nanostructures form a three-dimensional organisation.

BRIEF DESCRIPTION OF THE DRAWINGS

The invention will be better understood and other advantages and specific features will become clear after reading the following description, given as a non-limitative example accompanied by the attached drawings among which.

DETAILED DESCRIPTION OF EMBODIMENTS OF THE INVENTION

The following part of the description relates to making nanostructures on a support.

Figure 1:
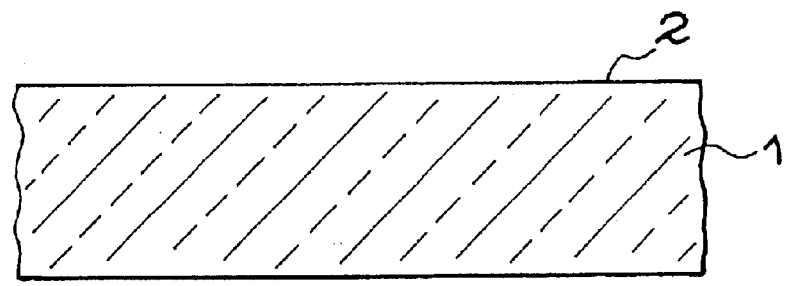
FIG. 1 is a cross-sectional view of a substrate made of a crystalline material and with a surface with a stress field, this substrate being usable for making a nanostructure support according to the invention.

The device according to the invention includes a support composed of a substrate and a layer of material called the intermediate layer on which the nanostructures are deposited. For example, the substrate may be of the type described in document FR-A-2 766 620. FIG. 1 shows such a substrate, reference 1, with a surface 2 with a stress field.

The surface 2 of the substrate 1 is treated such that the intermediate layer formed on it is covering, uniform and homogeneous. For a substrate made of silicon, this treatment may be based on chemistry based on dilute HCl including ozone according to a known technique in microelectronics.

Figure 2:
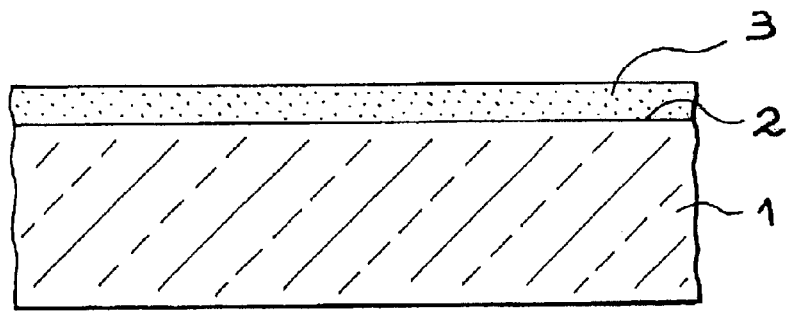
FIG. 2 is a cross-sectional view of a nanostructure support according to the invention.

FIG. 2 shows the substrate 1 in FIG. 1 supporting an intermediate layer 3 formed from the treated surface 2. The intermediate layer 3 may be deposited on the surface 2 by a PVD technique or a CVD technique or a combination of the PVD and CVD techniques. If the substrate 1 is made of silicon, the intermediate layer 3 may be made of $SiO_2$, $Si_3N_4$, or oxynitride. It may be made of a dielectric material, or a heat conducting material (for example diamond), or an electrically conducting material (for example Cu or Al). It may be a semi-metal (bismuth, $Fe_3O_4$, NiMnSb, $CrO_2$), or an optical filtering material.

A variant for the formation of an intermediate layer consists of depositing a material on the substrate and modifying the nature by adding energy. For example, aluminium can be deposited on silicon and annealing can then be done under an oxidising atmosphere so as to obtain an $Al_2O_3$ intermediate layer.

The intermediate layer is then created by changing the nature of part of the substrate, by consumption of the substrate material by an appropriate surface treatment. This treatment may consist of an RTO ("Rapid Thermal Oxidation") type annealing under a controlled atmosphere ($O_2$, $H_2$, $N_2$, Ar), or in the furnace. This treatment may also consist of ionic implantation followed by annealing. The surface of the substrate may also be subjected to plasma or laser irradiation.

In the special case of silicon substrate for which the surface was treated to adapt it to the formation of an intermediate layer as described above and in which the oxide layer is formed by RTO, it would be advantageous to choose an oxygen dilution of less than 10%, a temperature of the order of 800° C. and an annealing time of a few minutes.

The intermediate layer may also be obtained by making the substrate layer subjacent to the surface react with a material deposited on this surface. For example, the reaction may be obtained by adding energy. Thus, in the case of a silicon substrate, a platinum or titanium layer forms a silicide after annealing.

Combinations of these techniques for the formation of layers may be adopted to form the intermediate layer.

The thickness and/or composition of the intermediate layer and/or its surface state are chosen such that the substrate stress field is transmitted through the intermediate layer as far as the surface that is then suitable for well controlled production of nanostructures.

Advantageously, the thickness of the intermediate layer is chosen to be of the order of 1 nanometer. This gives better efficiency of the deformation and/or all or part of the surface topology related to the stress field.

The intermediate layer may be made of a dielectric material to obtain better control over the transport properties of electrons in nanostructures.

Figure 3:
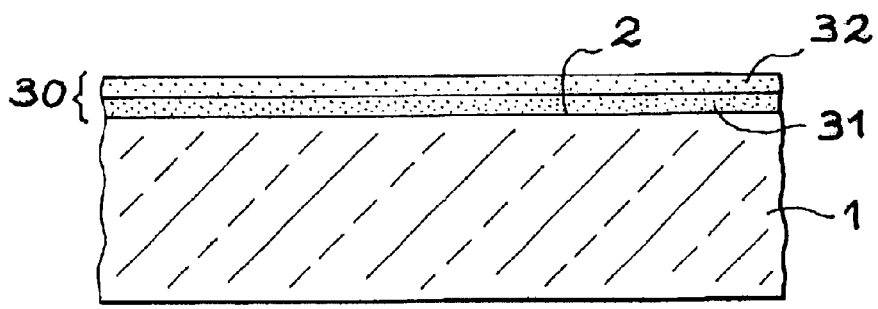
FIG. 3 is a cross-sectional view of another nanostructure support according to the invention.

Depending on the target application, the intermediate layer may be composed of a stack of sub-layers to achieve compatibility firstly with the substrate, and secondly with the nanostructures. FIG. 3 shows an example of a substrate 1 made of silicon for which the surface 2 supports an intermediate layer 30 composed of a sub-layer 31 made of $SiO_2$, deposited directly on the surface 2, and a sub-layer 32 made of $Al_2O_3$ that will be used for deposition of the nanostructures.

The intermediate layer may also be used to control diffusion of elements between the substrate and nanostructures. For example, contaminating elements such as aluminium can diffuse in the intermediate layer in the lattice as far as the free surface, and facilitate the growth of nanostructures at their location. The intermediate layer may also act as a barrier to contaminating elements present in a zone close to the surface on which the intermediate layer was deposited.

The stress state of the intermediate layer may also be suitable for making the required auto-organisation of the nanostructures. This stress may be due to different values of thermal expansion coefficients between a single intermediate layer and the substrate, or between different sub-layers of an intermediate layer and the substrate.

This stress may also be due to the variation in the growth parameters of the intermediate layer (deposition temperature, thickness, growth method). Thus, a nitride layer can be deposited that may be in tension or compression with stresses of the order of a few tens of MPa. In the case of an intermediate layer composed of sub-layers, the variation of the growth parameters of the different sub-layers (thickness, deposition temperature, growth mode) enables control over the value of the imposed stress.

Figure 4:
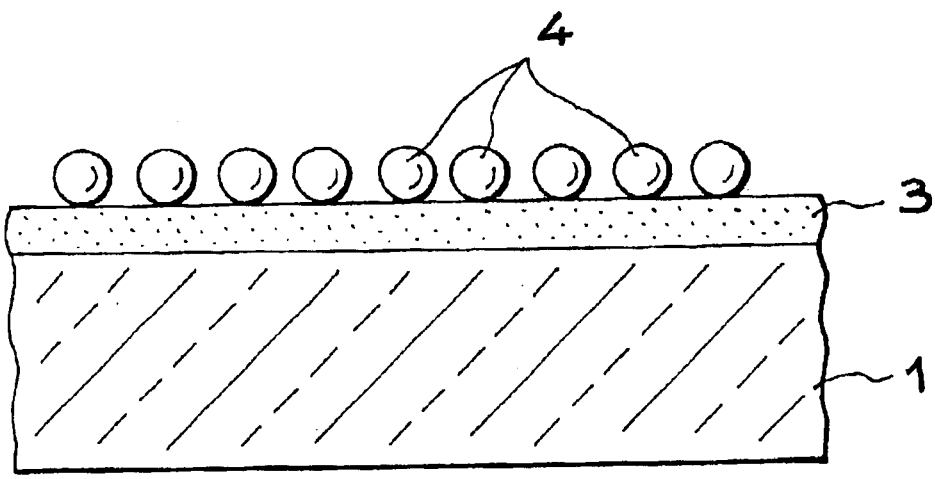
FIG. 4 is a cross-sectional view of a device consisting of nanostructures on a support according to the invention.

FIG. 4 shows nanostructures 4 deposited on a support comprising a substrate 1 and an intermediate layer 3, as shown in FIG. 2. The operating conditions are adjusted so as to form islands with a size of between 1 and several tens of nanometers, with the least possible dispersion (for example less than 10%) and with sufficient density for the target application. The density may be $10^{12}$ islands/$cm^2$ for transporting electrons from one nanostructure to another.

This step for deposition of nanostructures may be complemented by a subsequent step of heat treatment under a controlled atmosphere, another deposition (for example a thin dielectric) in order to fix the interface conditions or to improve the properties of the nanostructure or to obtain a re-arrangement or to modify the size dispersion of the nanostructures.

A later step may be carried out to add elements such as erbium to the nanostructures, which can give better photoluminescence properties.

The two-dimensional or three-dimensional organisation of a first deposition of nanostructures may also be used advantageously to stack one or several other nanostructure depositions alternately or not alternately with another deposition, varying or not varying the density of nanostructures and consequently modifying their photoluminescence efficiency.

We will now give a more precise description of one embodiment of a device according to the invention.

The substrate is prepared according to the teaching of document FR-A-2 766 620. A silicon wafer is used, with a p doped surface crystallographic plane (1,0,0) with resistivity between 14 and 22 $\Omega$.cm, and 520 $\mu$m thick. An SOI structure is also used comprising a thin silicon film, with a p doped surface crystallographic plane (1,0,0) with resistivity between 14 and 22 $\Omega$.cm. The wafer is brought into bonding contact with the thin film of the SOI structure. The angle of rotation between the wafer and the thin film is 5°. The relative tilt angle is 0.4°. After eliminating the SOI structure and the oxide layer from the support, the substrate obtained is prepared for implementation of the invention.

The surface of the substrate on which the intermediate layer will be formed is treated in a 10% HF bath using the so-called DDC technique. Information about this technique can be obtained by referring to the "Diluted Dynamic Clean: DDC" article by F. TARDIF et al., UCPSS'96, 1996, pages 175 to 178.

A 1.2 nm thick intermediate silicon oxide layer is then formed by RTO (temperature 800° C.—10% of $O_2$ diluted in $N_2$).

Silicon nanostructures are then deposited by LPCVD using $SiH_4$ at 620° C. at a pressure of 35 mTorr (about 4.66 Pa). The equivalent thickness of the deposition is between 0.5 and 1 nm. The result is then a two-dimensional lattice of 6 nm nanostructures on an 10 nm×15 nm lattice.

Figure 5:
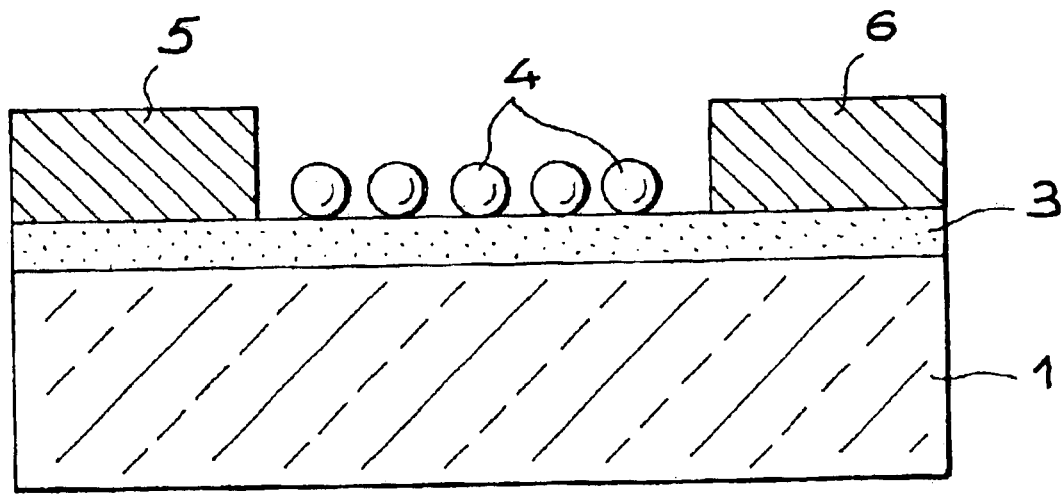
FIG. 5 shows a device using nanostructures on a support according to the invention.

FIG. 5 is an example application that uses the device in FIG. 4. In this example application, the nanostructures 4 are placed between electrodes 5 and 6 deposited on the intermediate layer 3. This type of device is a means of studying the transport of electrons from one nanostructure to another.

What is claimed is:

1. Process for making microstructures or nanostructures on a support, comprising the following steps:

a) supply of a substrate (1) comprising at least one part composed of a crystalline material, this part having a surface (2) with a stress field or a topology associated with a stress field, the stress field being associated with dislocations, the surface (2) being adapted to the formation of a layer of material called the intermediate layer, b) formation of the intermediate layer (3) starting from said surface (2), the thickness and/or composition and/or a surface state of the intermediate layer (3) being chosen such that the stress field can be transmitted through this layer as far as its free face that is suitable for the formation of microstructures or nanostructures, the substrate (1) and the intermediate layer (3) forming said support, c) auto-organised deposition of microstructures and nanostructures (4) on the free face of the intermediate layer (3).

2. Process according to claim 1, characterized in that step a) includes bringing two wafers of crystalline material into contact such that the crystalline lattices formed on the faces of the wafers brought into contact are offset by an angle enabling the formation of a network of crystalline defects within a crystalline zone close to the interface of the two wafers, one of the wafers then being thinned to reveal said surface with a stress field or topology associated with a stress field.

3. Process according to claim 1, characterized in that step a) includes a surface treatment to adapt said surface (2) to the formation of an intermediate layer.

4. Process according to claim 1, characterized in that the intermediate layer (3) is a layer deposited on said surface using a PVD and/or a CVD technique.

5. Process according to claim 1, characterized in that the intermediate layer (3) is obtained by a preliminary deposition of a material on said surface (2), this preliminary deposition being followed by a treatment to obtain the composition chosen for the intermediate layer.

6. Process according to claim 1, characterized in that the intermediate layer (3) is obtained by a treatment transforming a layer of the substrate subjacent to said surface (2) into the composition chosen for the intermediate layer.

7. Process according to claim 1, characterized in that the intermediate layer (3) is obtained by making a layer of the substrate subjacent to said surface react with a material deposited on said surface to obtain said chosen composition.

8. Process according to claim 1, characterized in that the intermediate layer is composed of a stack of sub-layers.

9. Process according to claim 8, characterized in that the sub-layers are composed of the same material but have different roughnesses.

10. Process according to claim 8, characterized in that the sub-layers are composed of different materials.

11. Process according to claim 10, characterized in that the different materials for the sub-layers are selected among $SiO_2$ and $Si_3N_4$.

12. Process according to claim 8, characterized in that the sub-layer stack includes sub-layers with stress values with opposed signs.

13. Process according to claim 1, characterized in that the intermediate layer is formed to have a stress state encouraging the auto-organised deposition of microstructures or nanostructures.

14. Process according to claim 13, characterized in that the intermediate layer is formed so that the coefficients of thermal expansion of the intermediate layer and the substrate are different so that the intermediate layer has said stress state.

15. Process according to claim 13, characterized in that the intermediate layer is formed by varying its growth parameters so as to have said stress state.

16. Process according to claim 13, characterized in that the intermediate layer is formed so that its cell parameter is different from the cell parameter of the substrate so that the intermediate layer has said stress state.

17. Process according to claim 1, characterized in that the auto-organised deposition of microstructures or nanostructures (4) is done using a technique chosen from among PVD deposition, CVD deposition, LPCVD deposition, liquid epitaxy, dipping, gaseous epitaxy and plasma deposition.

18. Process according to claim 1, characterized in that the auto-organised deposition step comprises superposition of depositions, a first deposition being made on a free face of the intermediate layer and at least one second deposition being done afterwards to obtain a three-dimensional organisation of the microstructures or nanostructures.

19. Process according to claim 1, characterized in that the free face of the intermediate layer is treated to form a relief on it such that the microstructures or nanostructures are deposited according to a three-dimensional organisation.

20. Device composed of microstructures or nanostructures on a support, characterised in that this support comprises:

a substrate (1) comprising at least one part made of a crystalline material, this part having a surface (2) with a stress field or a topology associated with a stress field, the stress field being associated with dislocations, an intermediate layer (3) bonded to said surface (2) and having a thickness and/or composition and/or a surface state enabling transmission of said stress field through this layer as far as its free face that supports the microstructures or nanostructures (4).

21. Device according to claim 20, characterized in that the substrate is composed of a wafer of crystalline material bonding to a thin film of crystalline material at the contact faces, the crystalline lattices presented by the faces in contact being offset by an angle enabling the formation of a lattice of crystalline defects within a crystalline zone close to the interface between the wafer and the thin film.

22. Device according to claim 20, characterized in that the intermediate layer is composed of a stack of sub-layers.

23. Device according to claim 20, characterized in that the intermediate layer is a layer with a stress state encouraging auto-organised deposition of microstructures or nanostructures.

24. Device according to claim 23, characterized in that the coefficients of thermal expansion of the intermediate layer and the substrate are different so that the intermediate layer has said stress state.

25. Device according to claim 20, characterized in that the microstructures or nanostructures are arranged in superposed layers, thus forming a three-dimensional organisation.

26. Device according to claim 20, characterized in that the intermediate layer has a free face with relief such that the microstructures or nanostructures form a three-dimensional organisation.

* * * * *

UNITED STATES PATENT AND TRADEMARK OFFICE
CERTIFICATE OF CORRECTION

PATENT NO. : 6,724,017 B2
DATED : April 20, 2004
INVENTOR(S) : Semeria et al.

It is certified that error appears in the above-identified patent and that said Letters Patent is hereby corrected as shown below:

<u>Title page,</u>
Item [75], Inventors, should read as follows:
-- [75]  Inventors: Marie-Noëlle Semeria, St. Nizier du Moucherotte (FR); Pierre Mur, Crolles (FR); Franck Fournel, Moirans (FR); Hubert Moriceau, Saint-Egreve (FR); Joël Eymery, Sassenage (FR); Noël Magnea, Moirans (FR); Thierry Baron, Fontaine (FR); François Martin, Grenoble (FR) --

Item [73], Assignees, should read as follows:
-- [73]  Assignees: Commissariat a L'Energie Atomique, Paris (FR); Centre National de la Recherche Scientifique, Paris (FR) --

Signed and Sealed this

Twelfth Day of July, 2005

JON W. DUDAS
*Director of the United States Patent and Trademark Office*